United States Patent
Noh et al.

(10) Patent No.: US 10,312,945 B2
(45) Date of Patent: Jun. 4, 2019

(54) CHANNEL CODING METHOD USING CONCATENATED CODE STRUCTURE AND APPARATUS THEREFOR

(71) Applicant: LG ELECTRONICS INC., Seoul (KR)

(72) Inventors: Kwangseok Noh, Seoul (KR); Dongkyu Kim, Seoul (KR); Sangrim Lee, Seoul (KR); Hojae Lee, Seoul (KR); Myeongjin Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/431,700

(22) Filed: Feb. 13, 2017

(65) Prior Publication Data

US 2018/0234115 A1   Aug. 16, 2018

(51) Int. Cl.
H03M 13/00   (2006.01)
H03M 13/29   (2006.01)
H04L 1/00   (2006.01)
H03M 13/11   (2006.01)

(52) U.S. Cl.
CPC ... *H03M 13/2966* (2013.01); *H03M 13/2993* (2013.01); *H03M 13/6525* (2013.01); *H04L 1/0041* (2013.01); *H04L 1/0045* (2013.01); *H04L 1/0064* (2013.01); *H03M 13/1194* (2013.01)

(58) Field of Classification Search
CPC .......... H03M 13/2966; H03M 13/253; H03M 13/258; H03M 13/6525
See application file for complete search history.

(56) References Cited

U.S. PATENT DOCUMENTS

| | | | | |
|---|---|---|---|---|
| 7,089,477 B1 * | 8/2006 | Divsalar | ............ | H03M 13/1111 714/755 |
| 7,116,710 B1 * | 10/2006 | Jin | ...................... | H03M 13/1102 375/240 |
| 7,423,996 B2 * | 9/2008 | Son | ..................... | H03M 13/1171 370/335 |
| 7,584,400 B2 * | 9/2009 | Gray | ...................... | H03M 13/03 714/755 |
| 7,774,689 B2 * | 8/2010 | Chiu | .................. | H03M 13/1197 714/752 |
| 8,111,670 B2 * | 2/2012 | Niu | ........................ | H03M 13/15 370/335 |
| 8,160,170 B2 * | 4/2012 | Golitschek Edler Von Elbwart | .................. | H04L 27/34 375/261 |
| 8,261,153 B2 * | 9/2012 | Chugg | ............... | H03M 13/1194 714/755 |
| 9,100,054 B2 * | 8/2015 | Lee | .................... | H03M 13/3738 |
| 9,374,110 B2 * | 6/2016 | Du | ...................... | H03M 13/395 |

(Continued)

*Primary Examiner* — Esaw T Abraham
(74) *Attorney, Agent, or Firm* — Lee, Hong, Degerman, Kang & Waimey

(57) ABSTRACT

Disclosed herein is a concatenated code encoding method for improving a turbo code. The concatenated code encoding method of the present disclosure includes encoding an input signal based on a repetition-accumulation (RA) code as an outer code, adding a tail bit to the encoded input signal, and encoding the encoded input signal based on the a turbo code. The concatenated code encoding method may further include interleaving the encoded input signal after application of the outer code.

8 Claims, 9 Drawing Sheets

(56) References Cited

U.S. PATENT DOCUMENTS 9,548,877 B2 * 1/2017 Land ............... H04L 27/18
9,667,274 B2 * 5/2017 Wang ............... H03M 13/118

* cited by examiner

CHANNEL CODING METHOD USING CONCATENATED CODE STRUCTURE AND APPARATUS THEREFOR

BACKGROUND OF THE INVENTION

Field of the Invention

The present invention relates to a channel coding method in a wireless communication system, and more particularly, to a channel coding method capable of satisfying URR (Ultra Reliable Radio) and LLR (Low Latency Radio) using a concatenated code structure and an apparatus therefor.

Discussion of the Related Art

Wireless communication systems have been widely deployed in order to provide various types of communication services including voice and data services. In general, a wireless communication system is a multiple access system that can support communication with multiple users by sharing available system resources (a bandwidth, transmission power, etc.). Examples of multiple access systems include code division multiple access (CDMA), frequency division multiple access (FDMA), time division multiple access (TDMA), orthogonal frequency division multiple access (OFDMA), single carrier frequency division multiple access (SC-FDMA), multi carrier frequency division multiple access (MC-FDMA), etc.

Broadcast systems as well as the aforementioned communication systems have necessarily used a channel code. As a general method for configuring a channel code, a transmitting end can encode an input symbol using an encoder and transmitted the encoded symbol. In addition, for example, a receiving end can receive the encoded symbol and decode the received symbol to restore the input symbol. In this case, the size of the input symbol and the size of the encoded symbol can be defined in different ways according to a communication system. For example, in a turbo code for data information used in a long term evolution (LTE) communication system of a $3^{rd}$ generation partnership project (3GPP), the size of the input symbol is a maximum of 6144 bits and the size of the encoded symbol is 18432 (6144*3) bites. Turbo coding in an LTE communication system may be referred to by the 3GPP technical standard 36.212.

However, the LTE turbo code has characteristics whereby enhancement in performance is slight when a signal to noise ratio (SNR) exceeds a predetermined range even if being increased due to a structure of the code. In this regard, a code with a low error rate as possible can be considered, but in this case, complexity is increased.

A high error rate in a communication system can cause retransmission of unnecessary data and failure in channel reception. In addition, a code with excessively high complexity can cause delay in transmission and reception as well as can increase loads of a base station and a user equipment (UE). In particular, a next-generation communication system that requires rapid transmission and reception of data as possible requires the aforementioned problems. Accordingly, there is a need for a coding method with a low error rate and low complexity.

In particular, a channel coding method capable of satisfying URR (Ultra Reliable Radio) and LLR (Low Latency Radio) is required.

SUMMARY OF THE INVENTION

Accordingly, the present invention is directed to a channel coding method using a concatenated code structure and an apparatus therefor that substantially obviates one or more problems due to limitations and disadvantages of the related art.

An object of the present invention is to provide a coding method capable of satisfying URR and LLR using a concatenated code.

A further object of the present invention is to provide an apparatus for supporting these methods.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of encoding a concatenated code includes generating a first codeword from an input signal using a repetition-accumulation (RA) code as an outer code, adding a tail bit to the first codeword, and generating a second codeword from the first codeword with the added tail bit using a turbo code as an inner code, wherein the generated first codeword comprises a plurality of regions, wherein each of the regions contains the input signal, wherein the tail bit is added to the last one of the regions.

In another aspect of the present invention, a method of decoding a concatenated code includes decoding a first codeword from a second codeword based on a turbo code, using a tail bit contained in the second codeword, and decoding an input signal from the first codeword based on a repetition-accumulation (RA) code, wherein the first codeword comprises a plurality of regions, wherein each of the regions contains the input signal, wherein the tail bit is added to the last one of the regions.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The following technology may be used for various wireless access systems such as CDMA (code division multiple access), FDMA (frequency division multiple access), TDMA (time division multiple access), OFDMA (orthogonal frequency division multiple access), and SC-FDMA (single carrier frequency division multiple access). The CDMA may be implemented by radio technology such as universal terrestrial radio access (UTRA) or CDMA2000. The TDMA may be implemented by radio technology such as global system for mobile communications (GSM)/general packet radio service (GPRS)/enhanced data rates for GSM evolution (EDGE). The OFDMA may be implemented by radio technology such as IEEE 802.11 (Wi-Fi), IEEE 802.16 (WiMAX), IEEE 802.20, and evolved UTRA (E-UTRA). The UTRA is a part of the universal mobile telecommunications system (UMTS). A 3rd generation partnership project long term evolution (3GPP LTE) communication system is a part of an evolved UMTS (E-UMTS) that uses E-UTRA, and employs OFDMA on downlink while employing SC-FDMA on uplink. LTE-advanced (LTE-A) is an evolved version of the 3GPP LTE system.

For the sake of clarity, 3GPP LTE/LTE-A is mainly described, but the technical idea of the present invention is not limited thereto. Specific terms used for the embodiments of the present invention are provided to help the understanding of the present invention. These specific terms may be replaced with other terms within the scope and spirit of the present invention.

Figure 1:
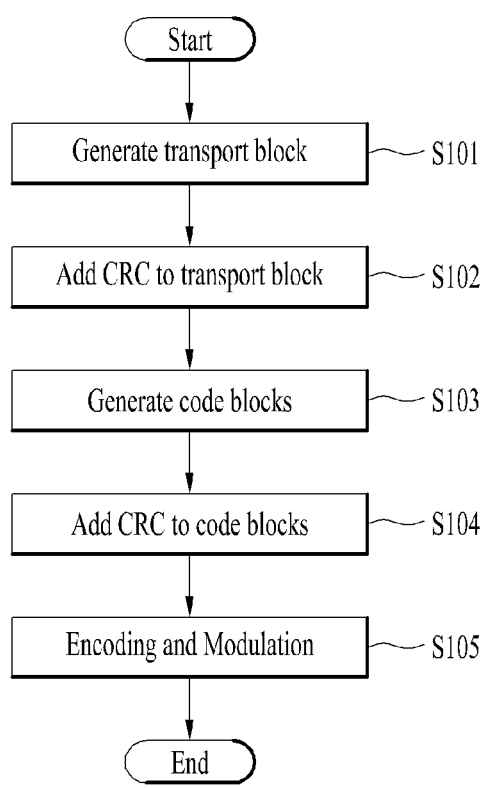
FIG. 1 illustrates a coding procedure according to an example.

FIG. 1 illustrates a coding procedure according to an example.

The coding procedure as shown in FIG. 1 may be applied to many channel codes including a turbo code used in the LTE communication system. Hereinafter, for simplicity, the coding procedure will be described based on terminology according to LTE communication system standards.

In the example of FIG. 1, the transmitting end may generate a transport block (TB) (S101). In addition, the transmitting end adds a CRC bit for the transport block to the transport block (S102). In addition, the transmitting end may generate code blocks from the transport block to which the CRC bit is added (S103). For example, the transmitting end may segment the transport block into code blocks based on the input size of the encoder. Further, the transmitting end may add a CRC bit for each divided code block (S104). In this case, for example, the code block and the code block CRC bits may be configured with a size of 6144 bits. The transmitting end may perform encoding and modulation (S105) on each block including code blocks and CRC bits. For example, turbo coding may be applied as described above.

The decoding procedure may be performed in the reverse order of the coding procedure of FIG. 1. For example, the receiving end may decode each code block using a decoder corresponding to each encoder, finally construct one transport block, and then check whether the transport block has passed the CRC.

For example, the size of the input symbols may be different from that of the transport block (TB) from the Media Access Control (MAC) layer. If the size of the transport block is larger than the maximum input symbol size of the turbo code, the transport block may be segmented into a plurality of code blocks (CB). According to the LTE communication system standard, the size of the code blocks may be equal to a result obtained by subtracting the CRC (Cyclic Redundancy Check) bits from 6144 bits. An input symbol of a turbo code may be defined as data including code blocks and CRC or data including a transport block (wherein the size of the transport block is less than, for example, 6144 bits) and CRC. The size of the CRC bits is very small (e.g., a maximum of 24 bits) compared to 6144 bits. Accordingly, in the following description, unless otherwise defined, a code block may refer to the code block itself or a CRC bit corresponding to the code block, and a transport block refers to the transport block itself or CRC bits corresponding to the transport block.

Figure 2:
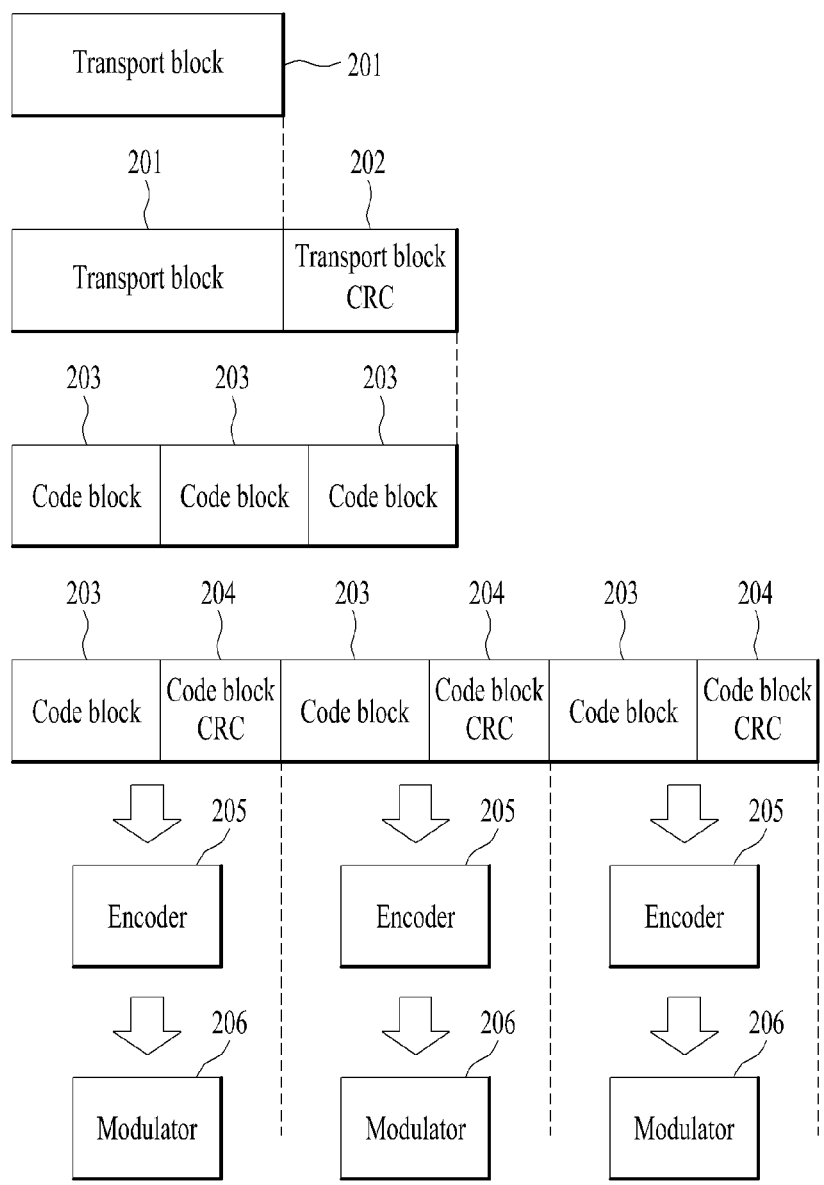
FIG. 2 illustrates a procedure of encoding a transport block according to an example.

FIG. 2 illustrates a procedure of encoding a transport block according to an example.

FIG. 2 illustrates a procedure of encoding a transport block 201 corresponding to the coding procedure described above with reference to FIG. 1. First, transport block CRC 202 is added to the transport block 201. The transport block CRC 202 may be used for identification of the transport block 201 in the decoding procedure. The transport block 201 and the transport block CRC 202 are then segmented into three code blocks 203. While the transport block 201 is segmented into three code blocks 203 in this embodiment, the transport block 201 may be segmented into a plurality of code blocks based on the input size of the encoder 205.

Code block CRC 204 is added to each of the code blocks 203. The code block CRC 204 may be used for identification of the code block 203 at the receiving end. The code blocks 203 and the code block CRC 204 may be coded via the encoder 205 and the modulator 206.

Figure 3:
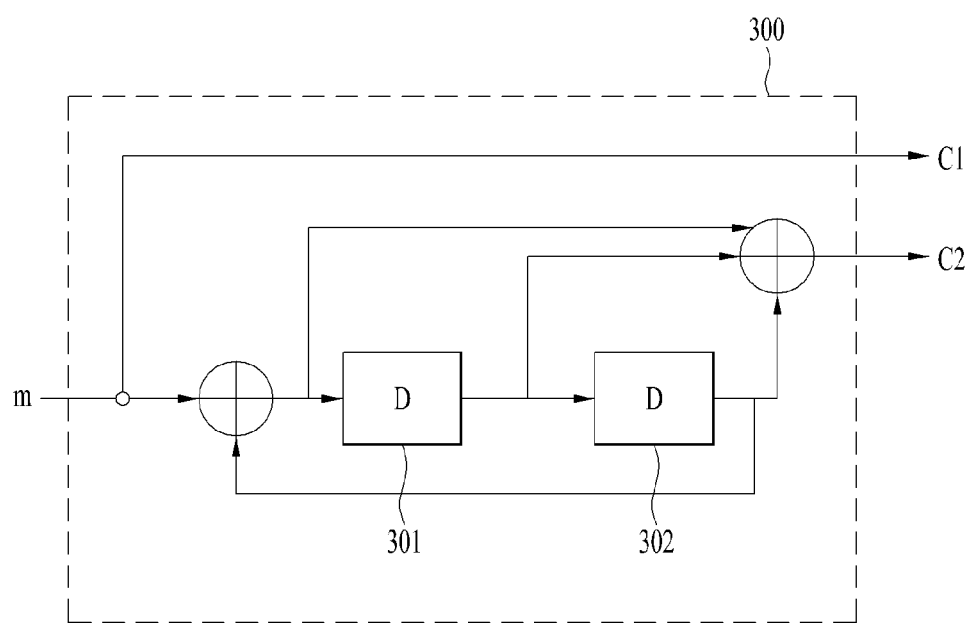
FIG. 3 illustrates a Recursive Systematic Convolutional (RSC) encoder according to an example.

FIG. 3 illustrates a Recursive Systematic Convolutional (RSC) encoder according to an example.

An RSC encoder 300 of FIG. 3 may be used for turbo coding. In FIG. 3, m denotes input data, C1 denotes a systematic bit string, and C2 denotes a coded bit string. Here, the RSC encoder 300 has a code rate of 1/2.

The RSC encoder 300 may be configured by feeding back a coded output to the input of a nonrecursive nonsystematic convolutional encoder. In the embodiment of FIG. 3, the encoder 300 includes two delay units 301, 302. The value D of the delay units 301 and 302 may be determined according to a coding scheme. The delay unit 301, 302 may include a memory or a shift register.

Figure 4:
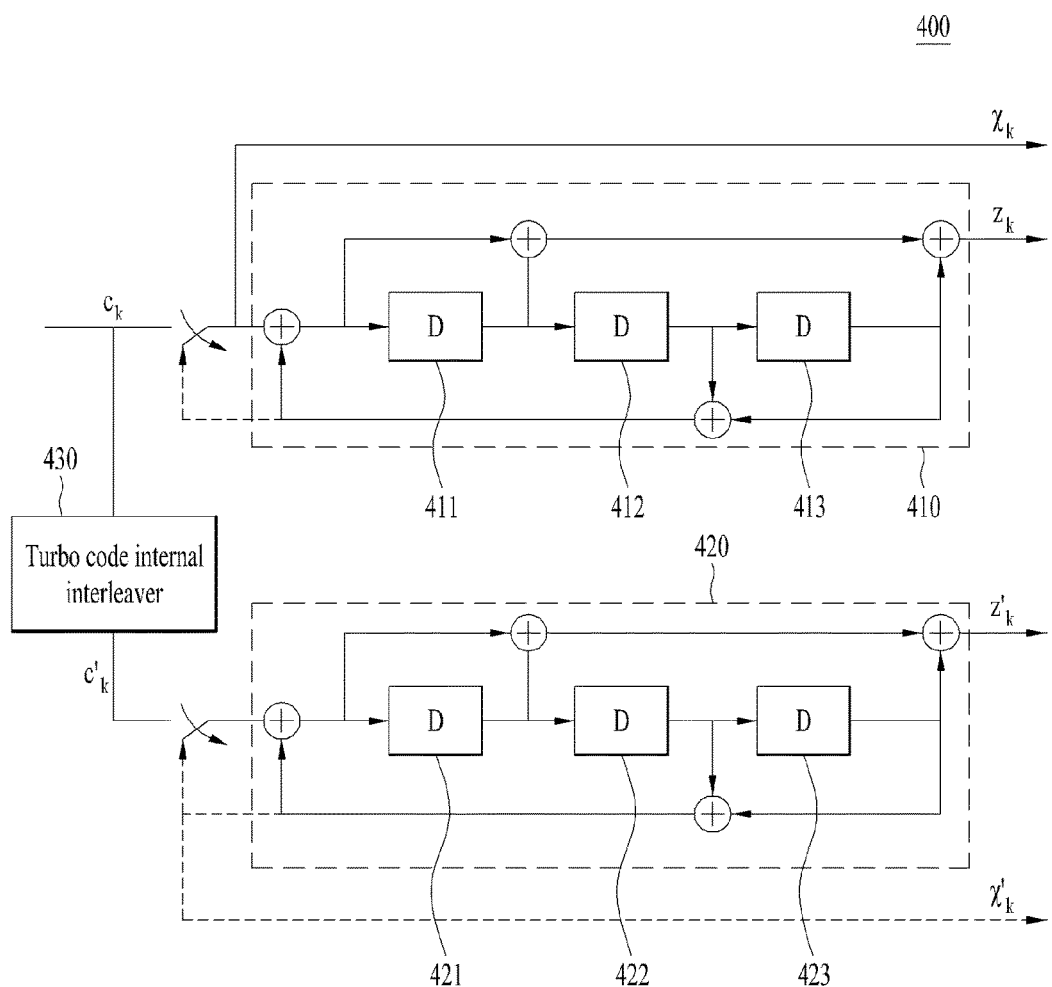
FIG. 4 illustrates an LTE turbo encoder.

FIG. 4 illustrates an LTE turbo encoder.

The coding scheme of the LTE turbo encoder 400 is a parallel concatenated convolutional code (PCCC) having two 8-state constituent encoders 410 and 420 and a turbo code internal interleaver 430.

In FIG. 4, the turbo encoder 400 includes a first constituent encoder 410, a second element encoder 420, and a turbo code internal interleaver 430. The first constituent encoder 410 and the second constituent encoder 420 are 8-state constituent encoders. The first constituent encoder 410 and the second constituent encoder 420 are configured in a structure similar to that of the RSC encoder of FIG. 3. Each of the first constituent encoder 410 and the second constituent encoder 420 includes three delay units 411, 412 and 413, 421, 422 and 423.

In FIG. 4, D is a value determined according to a coding scheme anx $c_k$ is an input to the turbo encoder 400. The outputs from the first constituent encoder 410 and the second constituent encoder 420 are denoted by $z_k$ and $z'_k$, respectively. The value output from the turbo code internal interleaver 430 is denoted by $c'_k$. Generally, the delay units 411, 412, 413, 421, 422, 423 may delay the input values by one clock. However, the delay units 411, 412, 413, 421, 422, 423 may be configured to delay the input values by more than one clock depending on the internal configuration thereof. The delay unit 411, 412, 413, 421, 422, 423 may include a shift register, delay an input bit by a predetermined clock, and then output the input bit to the next delay unit 411, 412, 413, 421, 422, 423.

The turbo code internal interleaver 430 may lower the influence of a burst error that may occur when a signal is transmitted over a radio channel. For example, the turbo code internal interleaver 430 may be a quadratic polynomial permutation (QPP) interleaver.

The turbo code is a high performance forward error correction (FEC) code and is used in the LTE communication system. For example, a data block coded by the turbo code may include three sub-blocks. One of the sub-blocks may correspond to m-bit payload data. Another subblock may be configured with n/2 bits, i.e., parity bits for the payload, calculated using a recursive systematic convolution (RSC) code. The other subblock may be configured with n/2 bits, i.e., parity bits for permutation of payload data, calculated using an RSC code. For example, the above-described permutation may be performed by an interleaver. Thus, two sub-blocks having different parity bits and the payload may constitute one block. For example, if m is equal to n/2, one block has a code rate of 1/3.

In the first constituent encoder 410, the procedure in which the input $c_k$ reaches the coded bit $z_k$ may be divided into two paths. The two paths are a first path connected from an input terminal to an output terminal without output feedback and a second path fed back from an input terminal to the input terminal.

In the first path, an input $c_k$ passed through the delay unit 411, and an input $c_k$ passed through the delay units 411, 412, and 413 are applied to the output terminal. The relationship between the input terminal and the output terminal for the first path may be expressed by a polynomial. The polynomial for the first path is called a forward generator polynomial and may be expressed as g1 in the following equation.

$$g1(D)=1+D+D^3 \qquad \text{Equation 1}$$

In the second path, an input $c_k$, an input $c_k$ passed through the delay units 411 and 412, and an input $c_k$ passed through the delay units 411, 412 and 413 are fed back to the input terminal. The polynomial for the second path is called a recursive generator polynomial and may be expressed as g0 in the following equation.

$$g0(D)=1+D^2+D^3 \qquad \text{Equation 2}$$

In Equations 1 and 2, "+" means exclusive OR (XOR), and 1 means that the input undergoes 0 delay. In addition, D" means that the input undergoes n delays.

Figure 5:
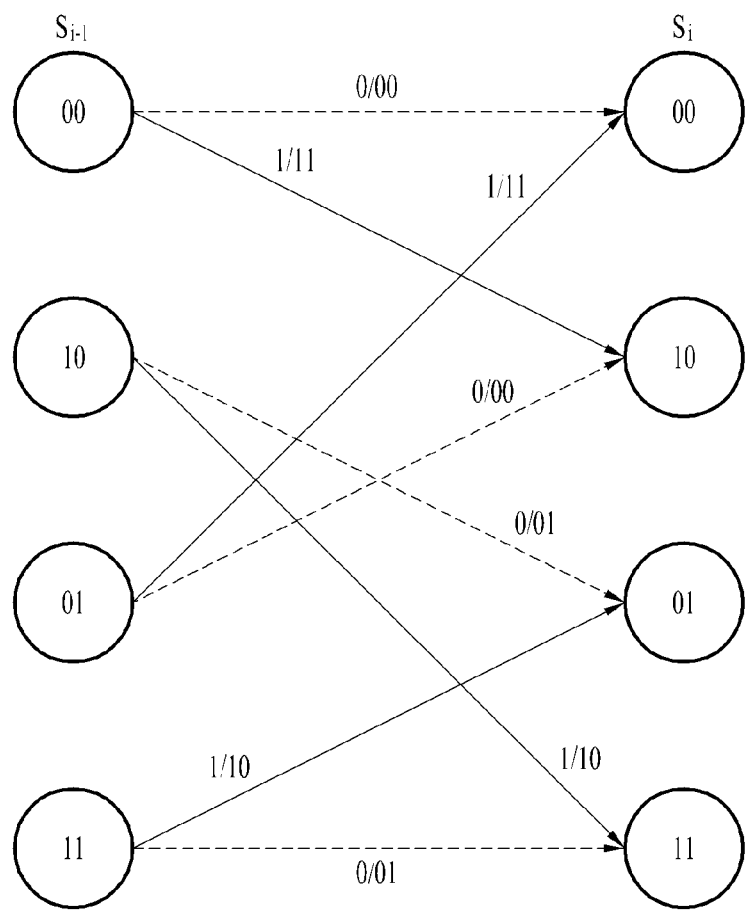
FIG. 5 illustrates an example of a trellis according to an RSC encoder.

FIG. 5 illustrates an example of a trellis according to an RSC encoder.

FIG. 5 shows the structure of the trellis of the RSC encoder shown in FIG. 3. In FIG. 5, $S_i$ denotes the state of the i-th input data. In FIG. 5, each circle represents a corresponding node. In addition, a line connected between nodes represents a branch. The solid line represents a branch for the input value of 1, and the dotted line represents a branch for the input value of 0. The value on a branch is indicated by m/C1C2 (input value/systematic bit, coded bit). The trellis may also have a state that is exponentially proportional to the number of memories of the encoder. For example, if the number of memories included in the encoder is a, $2^a$ states may be included in the trellis.

The trellis is a state machine that shows a possible state transition of an encoder between two states. A convolutional encoder such as the RSC encoder may perform coding according to a trellis diagram. The codeword coded by the RSC encoder may be decoded according to an algorithm based on the trellis structure. For example, the Viterbi or BCJR (Bahl, Cocke, Jelinek and Raviv) algorithm may be used.

Figure 6:
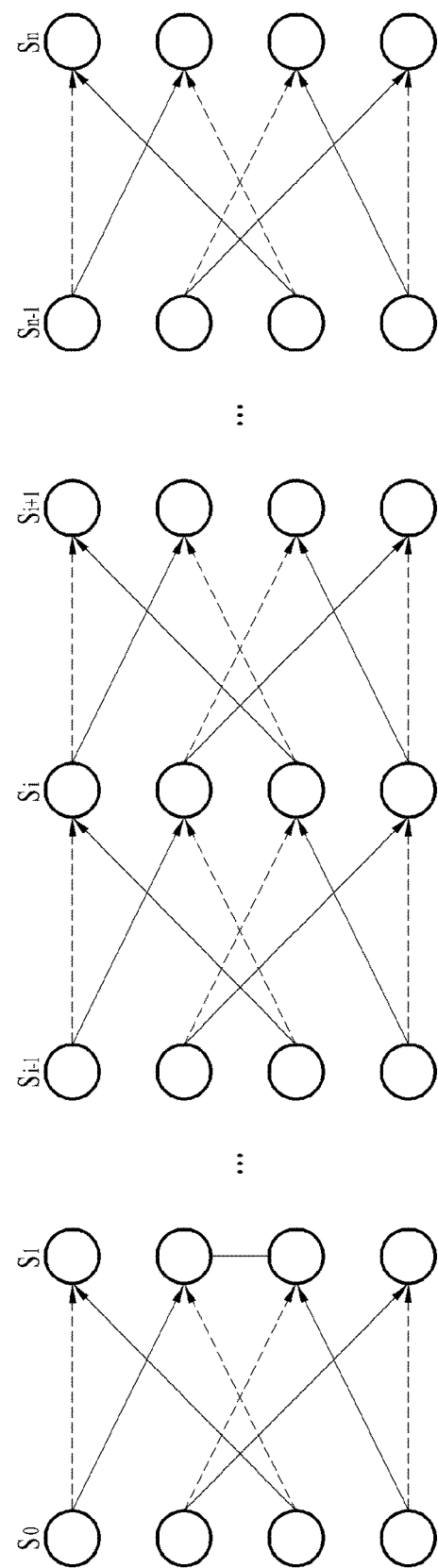
FIG. 6 illustrates an example of a trellis structure.

FIG. 6 illustrates an example of a trellis structure.

In FIG. 6, n denotes the length of a codeword. Typically, the trellis may be terminated by adding an additional bit after an input sequence. In general, a sequence configured as a sequence of 0 is referred to as a tail bit. The tail bit causes the nodes in one state of the trellis to have 0 as a value to terminate the trellis.

In FIG. 6, the length of the codeword may be determined in consideration of the length k of the input data and the length t of the tail bits. For example, if the code rate is R, the length n of the codeword may be (k+t)/R. In general, a length by which all delay units (e.g., memories) of the encoder may be reset may be determined as the length t of the tail bits. For example, the RSC encoder of FIG. 3 may use a total of 2 bits as the tail bits. The turbo encoder for LTE communication as shown in FIG. 4 may use 3 bits as the tail bits.

The length of the tail bits is shorter than the length of the input data. As described above, since the length of the codeword is associated with the length of the tail bits, loss of the code rate may occur due to the tail bits when the length of the codeword is limited. However, despite the loss of the code rate due to the tail bits, the trellis is terminated using the tail bits in many cases. This is because this method lowers computational complexity and exhibits excellent error correction performance.

The puncturing code refers to a method of puncturing a part of a codeword. In the puncturing code, a part of a codeword is punctured such that the part of the codeword is not transmitted. For example, the puncturing code may be used to lower the code rate loss caused by addition of tail bits. In this case, the receiving end may perform decoding using the trellis corresponding to the sum of the length k of the input data and the length t of the tail bits. That is, the receiving end may perform decoding on the assumption that the non-punctured codeword is received. In this case, the receiving end may consider that there is no input value for the branch from a node corresponding to the punctured bit (i.e., the bit not transmitted from the transmitting end). That is, for the branches of the node, the input data is assumed to be 0 or 1 with the same probability.

The turbo code may provide error correction performance that is close to Shannon's theoretical limit while having a relatively simple structure. However, when a specific SNR is exceeded, further improvement in decoding performance is insignificant. In other words, when a certain SNR is exceeded, the turbo code has an error-floor at which further improvement in error rate is insignificant.

To address this issue, two schemes may be considered. For example, a code that does not cause an error-floor compared to the current turbo code may be used. In addition, for example, a concatenated code may be used by adding overhead to the current turbo code.

Figure 7:
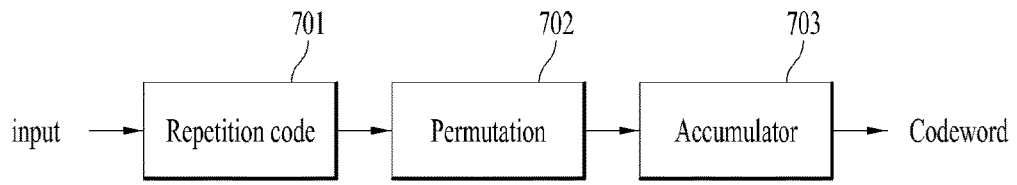
FIG. 7 illustrates an example of a Repetition-Accumulation (RA) code encoder.

FIG. 7 illustrates an example of a repetition-accumulation (RA) code encoder.

As an example of the concatenated code, a repetition-accumulation (RA) code may be used. FIG. 7 shows an example of the RA code encoder. A concatenated code such as the RA code may be implemented using two simple encoders (e.g., a repetition code 701 and an accumulator 703) and one processing operation (e.g., permutation 702) between the encoders.

For example, the RA code encoder may repeat data a predetermined number of times and replace the repeated data by a permutation matrix. Here, the permutation may be performed by an interleaver. The accumulator 703 may perform encoding on the replaced data by accumulating the information of the data.

The RA code has similar performance to the turbo code, but has a significantly lower complexity. The overall performance of the concatenated code including the RA code may be improved as the number of concatenated codes increases and the performance of individual concatenated codes is improved.

With regard to fifth generation mobile communication technology, reliable communication is being studied. Reliable communication represents a new communication service realized through error free transmission or service availability for realization of mission critical service (MCS). Reliable communication may be required for communication with real-time requirements such as Machine-to-Machine (M2M) communication. In addition, with regard to medical reasons or emergencies, reliable communication may be required.

Performance of the channel code needs to be improved to realize reliable communication. In order to improve the channel code, a code superior in performance to the current turbo code or the LDPC code may be used, or a code having higher overhead than the current code may be used.

For example, polar codes may be used as codes with better performance than the current code. However, this single code may exhibit little improvement of performance over the current code. For example, the single code may not meet the requirements for reliable communication depending on channel variation. In addition, due to increased complexity, the single code may not meet the requirement of low latency for reliable communication.

When a code having high overhead is used, decoding complexity may be generally increased along with improvement in performance. For example, in the case of the turbo code, increase in overhead leads to increase in the length of the trellis. Decoding of the current LTE turbo code is performed assuming maximum overhead. As described above, the number of possible states increases exponentially according to the length of the trellis. Thus, increase in overhead may exponentially increase decoding complexity.

Therefore, a coding method with a low decoding complexity while improving performance over the existing codes is required for reliable communication.

Hereinafter, for reliable communication, a channel coding method with improved performance is described. The following channel coding method may improve performance through addition of overhead while reducing decoding complexity.

As described above, for the convolutional code, when overhead is added, increase in overhead results in increase in decoding complexity. Thus, in the embodiments described below, a concatenated code structure may be used to minimize increase in complexity caused by increase in overhead.

Figure 8:
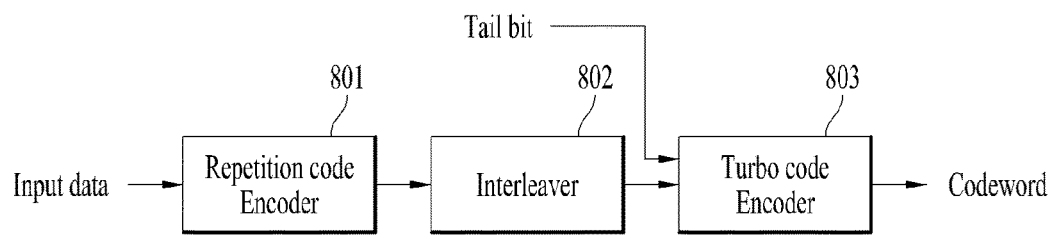
FIG. 8 illustrates an encoder according to an embodiment.

FIG. 8 illustrates an encoder according to an embodiment.

As shown in FIG. 8, the encoder of this embodiment may include a repetition code encoder 801, an interleaver 802, and a turbo code encoder 803. The encoder of FIG. 8 may use a repetition code as an outer code and a turbo code as an inner code. The interleaver 802 is positioned between the outer code and the inner code.

When the length of the codeword of FIG. 8 is n, the conventional decoding method for the convolutional code is performed on a codeword of fixed length 'n' irrespective of channel condition. When log-maximum a Pasteriori (MAP) decoding is used, decoding complexity may be defined as $n(25*2^M+13)$. When the number of memories (delay units) constituting the convolutional code is y, M is $2^y$.

As described above with reference to FIG. 7, the repetition code encoder 801 may repeat data a predetermined number of times. For example, the size of the input data may be k. In addition, the repetition code encoder 801 may be configured to repeat the input data r times. In this case, the size of the output data of the repetition code encoder may be r*k. The code rate Rout of the repetition code encoder 801 is 1/r.

The input/output size of the interleaver 802 may be k'. The interleaver 802 interleaves the input data according to a predetermined rule. The size k' of the interleaver 802 may be defined as k/Rout. While the encoder includes the interleaver 802 in this embodiment, the interleaver 802 may be omitted.

The input data having passed through the repetition code encoder 801 and the interleaver 802 is input to the turbo code encoder 803 together with tail bits. As described above, if the interleaver 802 is omitted, the input data and the tail bits having passed through the repetition code encoder 801 may be input to the turbo code encoder 803. The size of the tail bits may be assumed to be t. For example, the size t of the tail bits may be set to 3 bits as in the case of the LTE turbo code. The tail bits may consist of bits of a predetermined length having a value of, for example, 0 or 1. The turbo code encoder 803 receives the output data and the tail bits from the interleaver 802 as an input. In the embodiment of FIG. 8, the code rate of the turbo code encoder 803 is Rin. In this case, the size n of the codeword is (k'+t)/Rin.

Therefore, the encoder of FIG. 8 takes the form of a concatenated code, but is distinguished in that the tail bits are applied to the input of an outer code. Hereinafter, this embodiment will be described in more detail with reference to FIG. 9.

Figure 9:
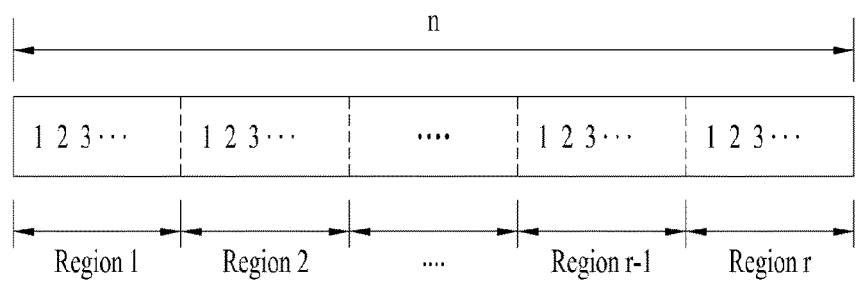
FIG. 9 illustrates an encoding block according to an embodiment.

FIG. 9 illustrates an encoding block according to an embodiment.

In the embodiment of FIG. 9, blocks are coded with the interleaver of FIG. 8 omitted. The blocks of FIG. 9 correspond to a codeword of length n from the turbo code encoder (i.e., inner code encoder) of FIG. 8.

In FIG. 9, the repetition code encoder is configured to repeat input data r times. Region 1 to region r−1 have a codeword length of the inner code before repetition. Tail bits of length t are added to the last region, region r. Here, when the number of repetitions of the outer code is r, the code rate Rout of the outer code is 1/r. The code rate of the inner code is Rin, and the output codeword of the outer code is k'. The length of the tail bits is t. In this case, the region 1 to region r−1 are assumed to be Rin*k'/r. In addition, the region r is Rin*(k'/r+t). Therefore, tail bits are input after the k'-bit string of the outer codeword.

In FIG. 9, the transmitting end may transmit the respective regions in reverse order. In addition, in one embodiment, systematic bits for at least one region may be transmitted. The size of the systematic bits may be determined based on the size of allocated resources.

When an interleaver, which is not used in FIG. 9, is used, the size of the interleaver may be determined as follows.

For example, the size of the input data may be k, and the coding rate of the outer code may be Rout. In this case, the interleaver may perform interleaving on the entire output codeword of the outer code. In this case, the size of the interleaver may be set to k*Rout. Therefore, in decoding the inner code, the receiving end may perform decoding for the length n of the entire codeword. As described above, the length n of the entire codeword may include a tail bit.

Further, for example, the interleaver may perform interleaving only within each region of FIG. 9. In this case, the size of the interleaver may be equal to the size k of the input data. That is, interleaving may be performed on each repeated input datum. In this case, the receiving end may perform inner code decoding for each region or for one or more regions.

In addition, for example, the interleaver may perform interleaving in a manner similar to interleaving of a quadratic permutation polynomial (QPP) interleaver. For the LTE turbo code, the QPP interleaver is used to avoid memory conflicts. Similarly, the interleaver may perform interleaving on some bits within the region. For example, the size of the interleaver may be k/c (where c is a number greater than or equal to 1). In this case, the receiving end may perform decoding of the inner code for each region or for one or more regions.

Hereinafter, a method of decoding a codeword coded according to the above-described embodiment will be described.

Referring to FIG. 9, the receiving end may perform inner code decoding for each region of the codeword, and performs decoding on the outer code. The transmitting end may transmit a codeword in reverse order of the regions from region r to region 1. In this case, the receiving end may receive a tail bit included in the region r before the other regions. Therefore, the receiving end may decode the received codeword using the tail bit. The receiving end may know the last state of region r−1 through the start state of the region r. The following decoding methods may be used to decode the first region (e.g., region r) received by the receiving end and the second region (region r−1) received subsequent to the first region simultaneously.

The receiving end may determine the start state of the first region by iterating a portion of the first region. In addition, the receiving end may perform decoding by using the start state of the first region as the last state of the second region. The start and last states of each region may be updated according to iteration of each region.

In addition, the receiving end may use a windowing decoding technique used in convolutional codes such as the turbo code. For example, the receiving end performs decoding without knowing the last state of a region (for example, the second region). In this case, the last state of the second region may be updated according to iteration of the next region (for example, the first region). The receiving end may reduce the length of the window as the state of the second region is gradually updated.

In addition, the above-described decoding method may be used to sequentially decode the respective regions.

Further, the receiving end may perform decoding on a part of the received data (codeword). For example, decoding may be performed with only a part of the codeword of length n. As described above, since the repetition code is used, the receiving end may perform decoding with only some of the regions. Therefore, if it is possible to perform decoding on at least one region, the receiving end may decode all input bits.

Figure 10:
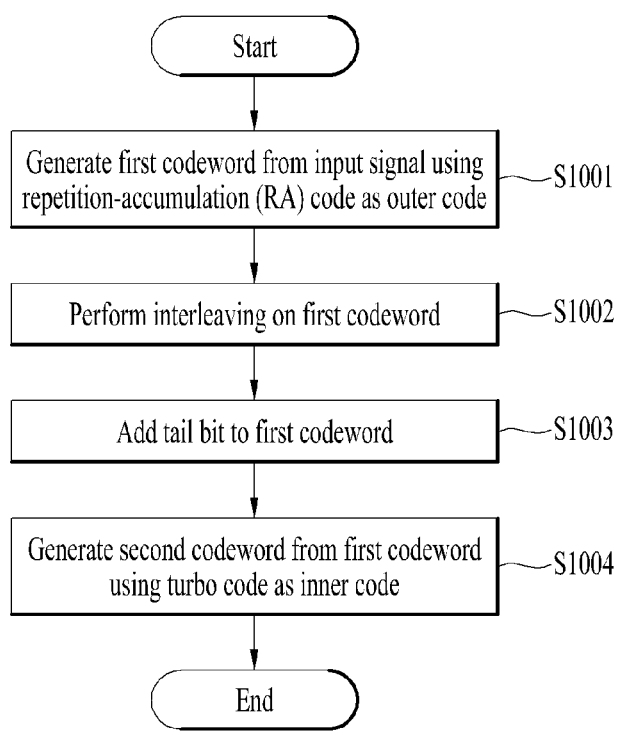
FIG. 10 is a flowchart illustrating a coding method according to an embodiment.

FIG. 10 is a flowchart illustrating a coding method according to an embodiment.

For simplicity, redundant description may be omitted. In the embodiments described below, the configuration of the present invention described above in relation to FIGS. 8 and 9 may be applied to the embodiment of FIG. 10. For example, the embodiment of FIG. 10 may be implemented by an encoder having the structure of FIG. 8.

The encoder may generate a first codeword from an input signal using a repetition-accumulation (RA) code from an outer code (S1001). The first codeword may be configured in a manner that input signals are repeatedly concatenated. For example, the first codeword may include a plurality of regions, and each of the regions may include an input signal.

The encoder may perform interleaving on the first codeword (S1002). However, as described above, the interleaving step (S1002) may be omitted. Further, as described above, the interleaving may be performed using various methods.

Further, the encoder adds tail bits to the first codeword (S1003). As described above, t bits used as the tail bits may be added to the last region of the first codeword. Further, the encoder may generate a second codeword from the first codeword using a turbo code as the inner code (S1004). For example, the encoder may encode the plurality of regions of the first codeword from the last region in reverse order, based on the turbo code. Although not shown in FIG. 10, the encoder may transmit the generated second codeword to the receiving end.

Further, at the receiving end, the decoder may perform decoding in reverse order of the encoding order. For example, the receiving end may decode the first codeword from the received second codeword using the turbo code, and decode the input signal from the first codeword based on the RA codeword. As described above, various decoding methods may be applied depending on whether interleaving is performed.

Figure 11:
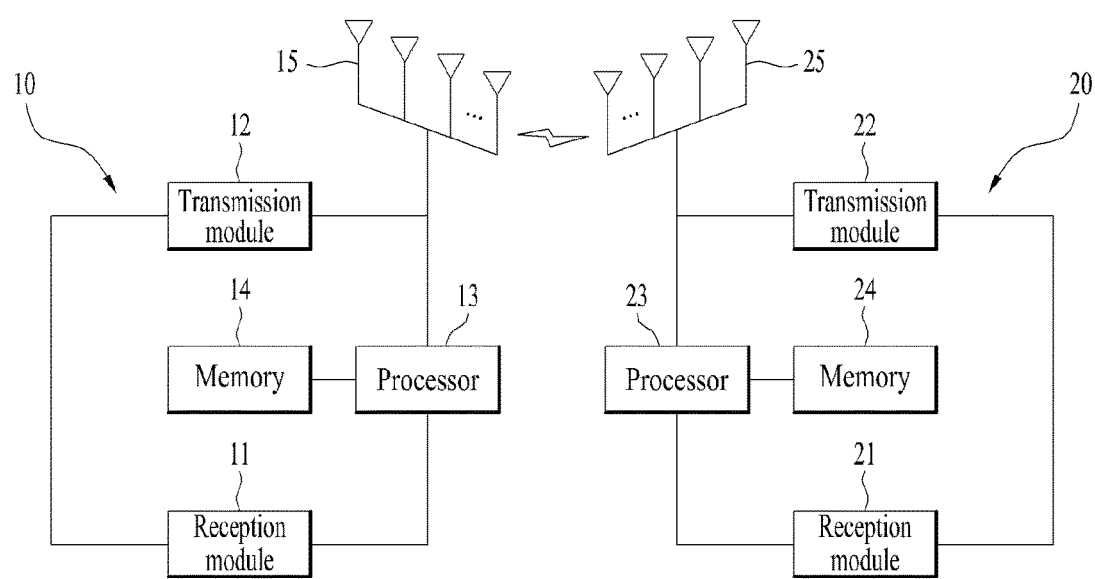
FIG. 11 is a diagram illustrating configuration of a base station and a user equipment according to an embodiment of the present invention.

FIG. 11 is a schematic diagram for explanation of components of apparatuses to which the embodiments of the present invention of FIGS. 1 to 10 are applicable, according to an embodiment of the present invention.

Referring to FIG. 11, a BS apparatus 10 according to the present invention may include a receiving module 11, a transmitting module 12, a processor 13, a memory 14, and a plurality of antennas 15. The transmitting module 12 may transmit various signals, data, and information to an external apparatus (e.g., a UE). The receiving module 11 may receive various signals, data, and information from an external apparatus (e.g., a UE). The receiving module 11 and the transmitting module 12 may each be referred to as a transceiver. The processor 13 may control an overall operation of the BS apparatus 10. The antennas 15 may be configured according to, for example, 2-dimensional (2D) antenna arrangement.

The processor 13 of the BS apparatus 10 according to an embodiment of the present invention may be configured to receive channel state information according to proposed embodiments of the present invention. In addition, the processor 13 of the BS apparatus 10 may perform a function for calculating and processing information received by the BS apparatus 10 and information to be externally transmitted, and the memory 14 may store the calculated and processed information for a predetermined time period and may be replaced with a component such as a buffer (not shown) or the like.

Referring to FIG. 11, a UE apparatus 20 according to the present invention may include a receiving module 21, a transmitting module 22, a processor 23, a memory 24, and a plurality of antennas 25. The antennas 25 refer to a terminal apparatus for supporting MIMO transmission and reception. The transmitting module 22 may transmit various signals, data, and information to an external apparatus (e.g., an eNB). The receiving module 21 may receive various signals, data, and information from an external apparatus (e.g., an eNB). The receiving module 21 and the transmitting module 22 may each be referred to as a transceiver. The processor 23 may control an overall operation of the UE apparatus 20.

The processor 23 of the UE apparatus 20 according to an embodiment of the present invention may be configured to transmit channel state information according to proposed embodiments of the present invention. In addition, the processor 23 of the UE apparatus 20 may perform a function for calculating and processing information received by the UE apparatus 20 and information to be externally transmitted, and the memory 24 may store the calculated and processed information for a predetermined time period and may be replaced with a component such as a buffer (not shown) or the like.

The aforementioned components of the BS apparatus 10 and the UE apparatus 20 may be embodied by independently applying the above description of the present invention or simultaneously applying two or more embodiments of the present invention, and a repeated description is not given for clarity.

In addition, with regard to the various embodiments of the present invention, although an example in which a downlink transmission entity or an uplink reception entity is an eNB and a downlink reception entity or an uplink transmission entity is a UE has been described, the scope of the present invention is not limited thereto. For example, the above description of the eNB may be applied in the same way to the case in which a cell, an antenna port, an antenna port group, an RRH, a transmission point, a reception point, an access point, a relay, etc. are a downlink transmission entity to a UE or an uplink reception entity from the UE. In addition, the principle of the present invention that has been described with regard to the various embodiments of the present invention may also be applied in the same way to the case in which a relay is a downlink transmission entity to a UE or an uplink reception entity to a UE or the case in which a relay is an uplink transmission entity to an eNB or a downlink reception entity from an eNB.

The embodiments of the present invention may be achieved by various means, for example, hardware, firmware, software, or a combination thereof.

In a hardware configuration, an embodiment of the present invention may be achieved by one or more application specific integrated circuits (ASICs), digital signal processors (DSPs), digital signal processing devices (DSDPs), programmable logic devices (PLDs), field programmable gate arrays (FPGAs), processors, controllers, microcontrollers, microprocessors, etc.

In a firmware or software configuration, an embodiment of the present invention may be implemented in the form of a module, a procedure, a function, etc. Software code may be stored in a memory unit and executed by a processor. The memory unit is located at the interior or exterior of the processor and may transmit and receive data to and from the processor via various known means.

The embodiments of the present invention described above are combinations of elements and features of the present invention. The elements or features may be considered selective unless otherwise mentioned. Each element or feature may be practiced without being combined with other elements or features. Further, an embodiment of the present invention may be constructed by combining parts of the elements and/or features. Operation orders described in embodiments of the present invention may be rearranged. Some constructions of any one embodiment may be included in another embodiment and may be replaced with corresponding constructions of another embodiment. It is obvious to those skilled in the art that claims that are not explicitly cited in each other in the appended claims may be presented in combination as an embodiment of the present invention or included as a new claim by a subsequent amendment after the application is filed.

As apparent from the above description, the present invention has effects as follows.

As a concatenated code is used, decoding complexity may be lowered.

As a repetition-accumulation code is used as an outer code, an error-floor may be prevented.

It will be appreciated by persons skilled in the art that that the effects that can be achieved through the embodiments of the present invention are not limited to those described above and other advantages of the present invention will be clearly understood from the following detailed description. That is, unintended effects according to implementation of the present invention may be derived by persons skilled in the art from the embodiments of the present invention.

It will be apparent to those skilled in the art that various modifications and variations may be made in the present invention without departing from the spirit or scope of the inventions. Thus, it is intended that the present invention covers the modifications and variations of this invention provided they come within the scope of the appended claims and their equivalents.

The embodiments of present invention are applicable to various wireless access systems and broadcast communication systems. Examples of the various wireless access systems may include a 3rd generation partnership project (3GPP), 3GPP2, and/or institute of electrical and electronic engineers 802 (IEEE 802).xx system. The embodiments of present invention are applicable to any technological fields that apply the various wireless access systems as well as the various wireless access systems.

What is claimed is:

1. A method of transmitting data encoded by a concatenated code, the method comprising:
generating a first codeword from an input signal using a repetition-accumulation (RA) code as an outer code;
adding at least one tail bit to a last region of the generated first codeword;
generating a second codeword from the generated first codeword and the added tail bit by using a turbo code as an inner code, the generated second codeword comprising a plurality of regions encoded in reverse order of the plurality of regions; and
transmitting the encoded data,
wherein the tail bit is added to a last of the plurality of regions.

2. The method according to claim 1, further comprising performing interleaving on the generated first codeword and the added tail bit.

3. The method according to claim 2, wherein the interleaving is performed on the generated first codeword and the added tail bit.

4. The method of claim 1, wherein generating the second codeword comprises:
   acquiring a start state of an N+1th of the plurality of regions by encoding the N+1th region, N being a natural number; and
   encoding the N+1th of the plurality of regions using the acquired start state as an end state of an Nth of the plurality of regions.

5. A method of receiving data encoded by a concatenated code, the method comprising:
   receiving the encoded data corresponding to a plurality of regions of a second codeword, at least one tail bit is added to a last of the plurality of regions;
   decoding the last of the plurality of regions to obtain the tail bit;
   decoding a first codeword from the plurality of regions based on a turbo code by using the tail bit; and
   decoding an input signal from the decoded first codeword based on a repetition-accumulation (RA) code, the decoding performed in reverse order of the plurality of regions.

6. The method of claim 5, wherein decoding the first codeword comprises:
   acquiring a start state of an N+1th region of the plurality of regions by decoding the N+1th region, N being a natural number; and
   decoding the N+1th of the plurality of regions using the acquired start state as an end state of an Nth of the plurality of regions.

7. The method of claim 5, further comprising performing deinterleaving on the decoded first codeword.

8. The method of claim 7, where the deinterleaving is performed on the decoded first codeword and the tail bit.

* * * * *